United States Patent
Osborn et al.

(10) Patent No.: US 12,124,906 B2
(45) Date of Patent: *Oct. 22, 2024

(54) CONTACTLESS CARD AND METHOD OF ASSEMBLY

(71) Applicant: Capital One Services, LLC, McLean, VA (US)

(72) Inventors: Kevin Osborn, Newton, MA (US); David Wurmfeld, Falls Church, VA (US)

(73) Assignee: Capital One Services, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,339

(22) Filed: Apr. 26, 2022

(65) Prior Publication Data

US 2022/0253663 A1 Aug. 11, 2022

Related U.S. Application Data

(63) Continuation of application No. 17/086,096, filed on Oct. 30, 2020, now Pat. No. 11,341,390, which is a continuation of application No. 16/731,337, filed on Dec. 31, 2019, now Pat. No. 10,860,914.

(51) Int. Cl.
*G06K 19/077* (2006.01)

(52) U.S. Cl.
CPC . *G06K 19/07749* (2013.01); *G06K 19/07722* (2013.01); *G06K 19/07747* (2013.01); *H01L 2224/48091* (2013.01); *H01L 2224/48151* (2013.01)

(58) Field of Classification Search
CPC ....... G06K 19/07773; G06K 19/07749; G06K 19/07722; G06K 19/07747
See application file for complete search history.

(56) References Cited

U.S. PATENT DOCUMENTS

| | | | |
|---|---|---|---|
| 6,215,295 B1* | 4/2001 | Smith, III | G01R 35/00 324/95 |
| 10,354,175 B1* | 7/2019 | Vittimberga | G06K 19/07747 |
| 2009/0213027 A1* | 8/2009 | Finn | G06K 19/0775 343/866 |
| 2018/0194158 A1* | 7/2018 | Ayala | G06K 19/07773 |
| 2019/0236433 A1* | 8/2019 | Maeng | H04M 1/02 |

* cited by examiner

*Primary Examiner* — Omeed Alizada
(74) *Attorney, Agent, or Firm* — KDW FIRM PLLC

(57) ABSTRACT

A method of forming a contactless transaction card. The method may include providing a card body, defining a window, and attaching an antenna assembly layer to the card body, where the antenna assembly layer includes an antenna, a set of curable connectors, disposed on a set of end regions of the antenna within the window, and a UV-transparent layer, supporting the antenna. The method may include providing a contactless chip module within the window on a first side of the antenna assembly layer, and directing radiation through the UV-transparent layer, wherein the contactless chip module is electrically connected to the antenna via the curable connectors.

19 Claims, 6 Drawing Sheets

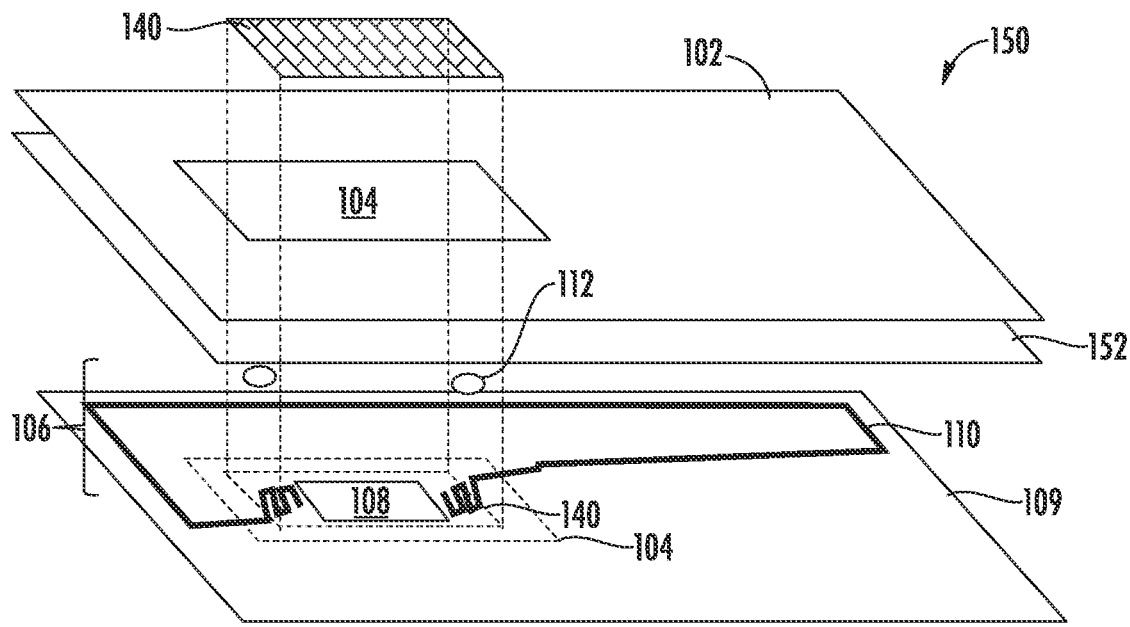
FIG. 3
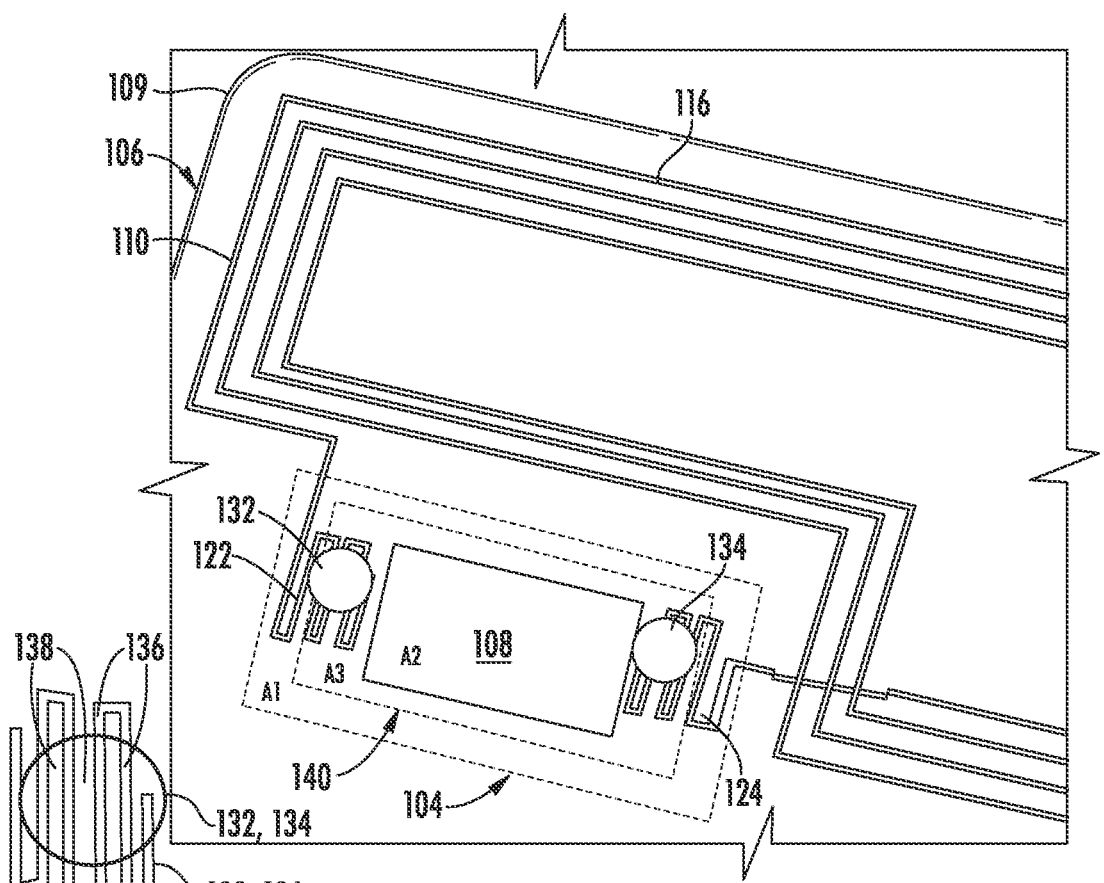
FIG. 4B
FIG. 4A

CONTACTLESS CARD AND METHOD OF ASSEMBLY

CROSS-REFERENCE TO RELATED APPLICATIONS

This application is a continuation of U.S. patent application Ser. No. 17/086,096 filed on Oct. 30, 2020, which is a continuation of U.S. patent application Ser. No. 16/731,337 filed on Dec. 31, 2019 (issued as U.S. Pat. No. 10,860,914 on Dec. 8, 2020). The contents of the aforementioned patent and patent applications are incorporated herein by reference in their entireties.

FIELD

Embodiments of the present disclosure relate to transaction cards and, more particularly, to transaction cards having a metallic body.

BACKGROUND

Generally, transaction cards such as smart credit/debit cards, access cards, EMV cards, and the like may include components such as electronic chips to perform memory storage, computing, or communication functions. Transaction cards having electronic chips generally include a region on or near the card surface to embed the electronic chip. Such cards may or may not have contactless capabilities. Contactless capability enables wireless communication using radio frequency (RF) signals provided by radio communication functionality built into the contactless card.

Metal transaction cards, such as metal credit cards, have enjoyed increasing popularity in recent years. Because the body of a metal credit cards is electrically conductive, there are various difficulties in fabricating a metal credit card, especially in the case of contactless cards that incorporate an electrically conductive antenna such as in the shape of a coil. One approach is to laminate a coil onto one side of the metal card. In the case of assembling a plastic transaction card, a layered stack formed of a front layer, back layer and coil may be preassembled, so that the electronic chip may be placed in the preassembled layer stack to be bonded to the other components of the card, using a conductive material. However, this bonding approach is somewhat imprecise, and does not present a robust approach for forming metal contactless cards, due to the possibility of accidental contact of the metal card body with the conductive material.

With respect to the above considerations, the present embodiments are provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of forming a contactless transaction card is provided. The method may include providing a card body, defining a window, and attaching an antenna assembly layer to the card body, where the antenna assembly layer includes an antenna, a set of curable connectors, disposed on a set of end regions of the antenna within the window, and a UV-transparent layer, supporting the antenna. The method may include providing a contactless chip module within the window on a first side of the antenna assembly layer, and directing radiation through the UV-transparent layer, wherein the contactless chip module is electrically connected to the antenna via the curable connectors.

In a further embodiment, a contactless transaction card is provided. The contactless transaction card may include a card body, defining a window, and an antenna assembly layer, disposed subjacent the card body, where the antenna assembly layer includes an antenna, comprising a set of end regions, a UV-transparent layer, supporting the antenna, and a set of curable connectors, disposed on the set of end regions. The set of end regions, and set of curable connectors may be disposed within the window. The contactless transaction card may further include a contactless chip module, disposed within the window, and electrically connected to the set of end regions, via the set of curable connectors.

In another embodiment, a method of forming a contactless transaction card, may include providing a card body that defines a window, and coupling an antenna assembly layer to the card body, where the antenna assembly layer includes an antenna, and a transparent layer, supporting the antenna. The method may include providing a first curable connector on a first end region of the antenna, and a second curable connector on a second end region of the antenna, wherein the first end region, the second end region, the first curable connector and the second curable connector are disposed in the window. The method may also include providing a contactless chip module within the window on a first side of the transparent layer, and directing radiation through the transparent layer from a second side of the transparent layer, opposite the first side. As such, the contactless chip module may be electrically connected to the antenna via the first curable connector and the second curable connector.

BRIEF DESCRIPTION OF THE DRAWINGS

The accompanying drawings illustrate example approaches of the disclosure, including the practical application of the principles thereof, as follows:

FIG. 3 is a side exploded view of another variant of the contactless card of FIG. 1, in accordance with embodiments of the present disclosure;

FIG. 4A is a top view illustrating an antenna assembly layer according to some embodiments of the disclosure;

FIG. 4B is a top view illustrating details of end region of an antenna, according to embodiments of the disclosure;

Figure 1:
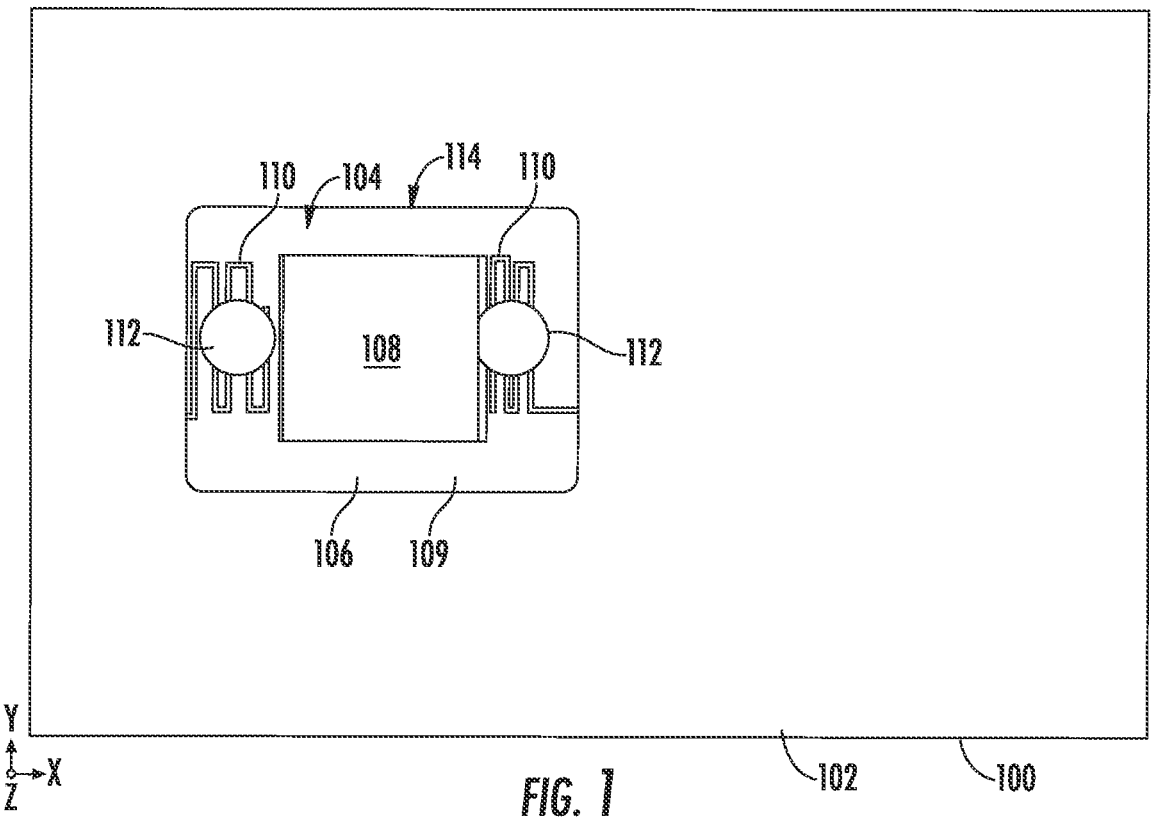
FIG. 1 is a top view illustrating a contactless card, in accordance with embodiments of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Embodiments herein are directed to contactless transaction cards including an electronic chip module, or semiconductor chip module, as well as an antenna. The present embodiments may be suitable, for example, in transaction cards having a metallic or otherwise electrically conductive body.

Figure 2:
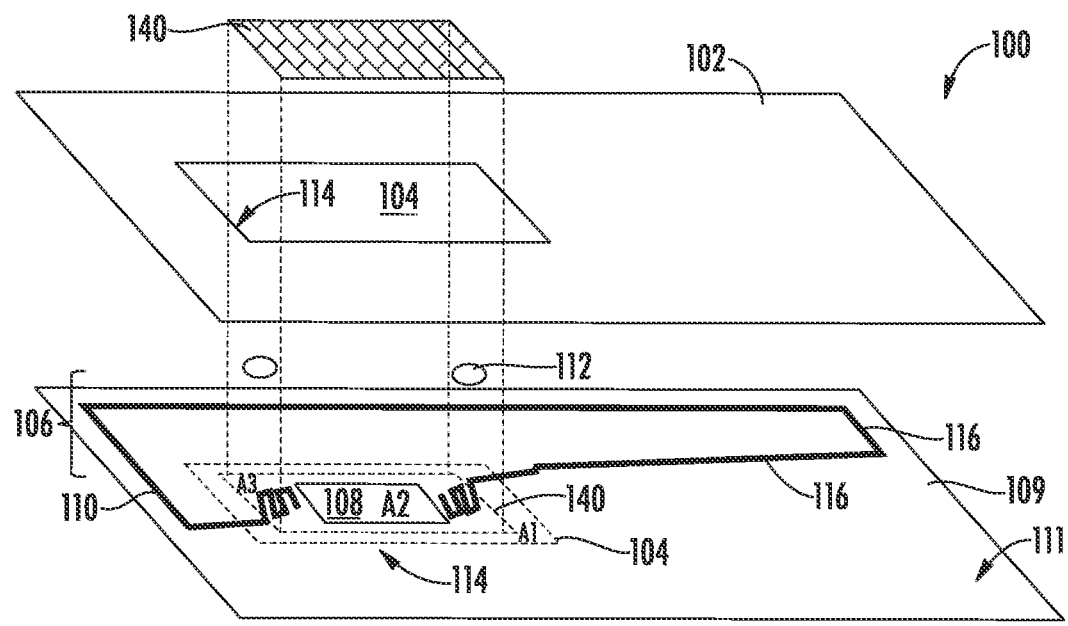
FIG. 2 is a side exploded view of a variant of the contactless card of FIG. 1, in accordance with embodiments of the present disclosure.

FIG. 1 is a top view illustrating a contactless card 100, arranged in accordance with embodiments of the present disclosure. FIG. 2 is a side exploded view of a variant of the contactless card of FIG. 1, in accordance with embodiments of the present disclosure, while FIG. 3 is a side exploded view of another variant of the contactless card of FIG. 1, in accordance with embodiments of the present disclosure.

As used herein, the term contactless card may refer to a transaction card, such as a credit card, debit card, or other card. The contactless card may include an electronic component, such as a semiconductor chip, or semiconductor chip module, as well as circuitry for wireless communication, such as an antenna. In various embodiments, contactless cards as detailed herein may be arranged in conformance with SO/IEC 7816, an international standard related to electronic identification cards with contacts, where the standard is managed jointly by the International Organization for Standardization (ISO) and the International Electrotechnical Commission (IEC).

As shown in FIG. 2, for example, the contactless card 100 may be arranged with a card body 102. In accordance with various embodiments, the card body 102 may formed of a metallic material. In these embodiments, the contactless card 100 may thus be deemed a metallic contactless card. Generally a card body of the contactless cards of the present embodiments may constitute a relatively thicker layer of a transaction card as opposed to other layers that are laminated together with the card body to form the complete contactless card. As shown in FIG. 1, for example, the contactless card 100 includes a window 104, representing an aperture or recess to accommodate an electronic chip module, which module may include an electronic chip and packaging, such as contacts, for electrically coupling to external components. In the embodiments of FIG. 1-3, the electronic chip module is configured to contact an antenna, for example, and is referred to herein as a contactless chip module 140. The contactless card 100 may include an antenna assembly layer 106, which layer is attached to the card body 102 after assembly. The antenna assembly layer 106 may include an antenna 110, a set of curable connectors 112, disposed on a set of end regions of the antenna 110 that lie within the window 104, and a UV-transparent layer 109, supporting the antenna 110. The set of end regions are shown as serpentine regions, located at opposite ends of the antenna 110. In various embodiments, these components of the antenna assembly layer 106 may be assembled to one another before attachment to other components of the contactless card 100, as detailed below.

As shown in FIG. 2, the contactless card 100 may also include a contactless chip module 140, within the window 104, and disposed on a first side of the antenna assembly layer 106, where the first side 111, is an upper side in the view of FIG. 2. When fully assembled the contactless chip module 140 may be electrically connected to the set of end regions, via the set of curable connectors 112. For example, the electronic chip module 140 may include a semiconductor die (not separately shown) and a set of contacts or leads that come into contact with the curable connectors 112.

As shown in FIG. 1, the curable connectors 112 may lie within the window 104 so as not to be in contact with the card body 102. Thus, in the case where the card body 102 is a metallic body, the curable connectors 112 and the antenna 110 will not be electrically shorted to the card body 102. As further shown in FIG. 2, the contactless chip module 140 may lie within the window 104 so as not to electrically contact the card body 102 at the edges 114 of the window 104.

Notably, while the antenna 110 may be disposed on the first side 111 of the UV-transparent layer 109, facing the card body 102, an insulator material, meaning an electrical insulator, may be disposed between the antenna 110 and the card body 102 in the outer region of the antenna 110 that lies outside of the window 104. In one example, the antenna 110 may be formed with a metallic core that is covered with an insulating coating. Thus, when assembled, where the card body 102 is bonded to the UV-transparent layer 109, the metallic core of the antenna 110 is still electrically isolated from the card body 102, preventing any electrical shorting between the antenna 110 and card body 102 in embodiments where the card body 102 is formed of a metallic material.

As further illustrated in FIG. 1 and FIG. 2, the UV-transparent layer 109 may define a recess 108. As shown in FIG. 2, the recess 108 is aligned within the window 104, such as being centered within the window 104. As shown in FIG. 2, the window 104 defines a first area (A1, the area within the dotted line, where the area is defined within the X-Y plane of the Cartesian coordinate system shown in FIG. 1), while the recess 108 defines a second area (A2, the area within the solid line) that is smaller than the first area. Notably, the contactless chip module 140 defines a third area (A3) intermediate in size between the first area and the second area.

FIG. 3 presents another embodiment of a contactless card 150, where the contactless card 150 includes various components of the contactless card 100, as discussed above. In this embodiment, an electrically insulating layer, shown as layer 152, is disposed between the antenna assembly layer 106 and the card body 102 to provide electrical isolation between the antenna 110 of antenna assembly layer 106 and the card body 102. Notably, the layer 152 may include an opening to form part of the window 104 in the region of the contactless chip module 140, to accommodate the contactless chip module 140 for connection to the antenna 110.

To assemble the contactless card 100 or contactless card 150, when the contactless chip module 140 is joined to the antenna assembly layer 106, the contactless chip module 140 may be aligned within the window 104, such as being generally centered within the window 104. Accordingly, when assembled, in the embodiments of FIGS. 2 and 3, the contactless chip module 140 is arranged within the window 104, and in electrical contact with the antenna 110 via the curable connectors 112, without contacting the card body 102.

To illustrate further details of the geometry for assembling a contactless card FIG. 4A is a top view showing details of the antenna assembly layer 106 according to some embodiments of the disclosure. In this view, a portion of antenna assembly layer 106 is shown that lies within the window 104, as well as an outer portion 116 of the antenna assembly layer 106 that lies subjacent to the card body 102, as explained previously. The antenna 110 may define any suitable shape, as generally shown in FIG. 4A. In two different end regions, the antenna 110 terminates within the window 104, as shown. In particular, an end region 122 and an end region 124 of the antenna 110 are arranged towards opposite sides of the window 104. In embodiments where the UV-transparent layer 109 includes the recess 108, the end region 122 and end region 124 may be arranged on opposite sides of the recess 108.

In particular embodiments, the set of end regions of an antenna, such as end region 122 and end region 124, may be arranged in a serpentine pattern (shown in FIG. 4A), spiral pattern, or other pattern. As further illustrated in FIG. 4A, a first curable connector 132 and a second curable connector 134 are arranged over the end region 122 and the end region 124, respectively. Moreover, the first curable connector 132 extends partially over the end region 122 of the antenna 110, and partially over an exposed region of the UV-transparent layer 109.

In particular, as shown in the detailed view of FIG. 4B, the serpentine pattern of the end region 122 or end region 124 defines open areas of the UV-transparent layer 109 that are not covered by the antenna 110. Thus, first regions 136 of the first curable connector 132 or second curable connector 134 will lie directly over the material of antenna 110, which material may be an opaque metal wire or foil. Second regions 138 of the first curable connector 132, or second curable connector 134 will lie directly over exposed regions of the UV-transparent layer 109. These second regions 138 will be directly exposed to light such as UV radiation and/or visible radiation that is directed to the underside of the UV-transparent layer 109, that is the side opposite to first side 111, defined above.

To facilitate assembly of the contactless card 100 or contactless card 150, for example, the curable connectors 112 (shown as first curable connector 132 and second curable connector 134 in FIG. 4A) may be formed of a conductive adhesive. Examples of a suitable conductive adhesive according to the present embodiments include a conductive epoxy material, or similar conductive composite. The conductive adhesive may be applied on top of the end region 122 and end region 124 as a dot or similarly shaped object, as suggested by the illustration of FIG. 4A. The first curable connector 132 and second curable connector 134 may be placed well away from the edge 114 of the window 104, so that when a card body 102 is brought into contact with the antenna assembly layer 106, the first curable connector 132 and second curable connector 134 do not deform sufficiently to touch the edge 114, avoiding electrical connection between the antenna 110 and card body 102.

Thus, with reference again to FIGS. 2 and 3, the aforementioned embodiments of a contactless card may be formed by the process of attaching the antenna assembly layer 106 to the card body 102, with optional layers disposed between the antenna assembly layer 106 and card body, such as in the embodiment of FIG. 3. As such, a window 104, already defined at least partially within the card body 102, will form a recess that extends at least to the top surface of the antenna assembly layer 106.

A contactless chip module 140 may then be provided within the window 104 on the first side 111 of antenna assembly layer 106. To affix the contactless chip module in the contactless card, and to electrically connect the contactless chip module to the antenna 110, the contactless chip module 140 may be brought into contact with the curable connectors 112 (or first curable connector132, second curable connector 134), so the curable connectors 112 may be cured while in contact with the contactless chip module 140. In this manner, after curing, a mechanical bond and an electrical connection is established between the antenna 110 and contactless chip module 140.

Advantageously, the curing of curable connectors 112 may take place by directing short exposures of radiation through the UV-transparent layer 109, while the contactless chip module 140 is in place within the window 104. The curable connectors 112 may be formed of a chemical or set of chemicals that are amenable to curing when exposed to suitable radiation, such as ultraviolet radiation.

Figure 5:
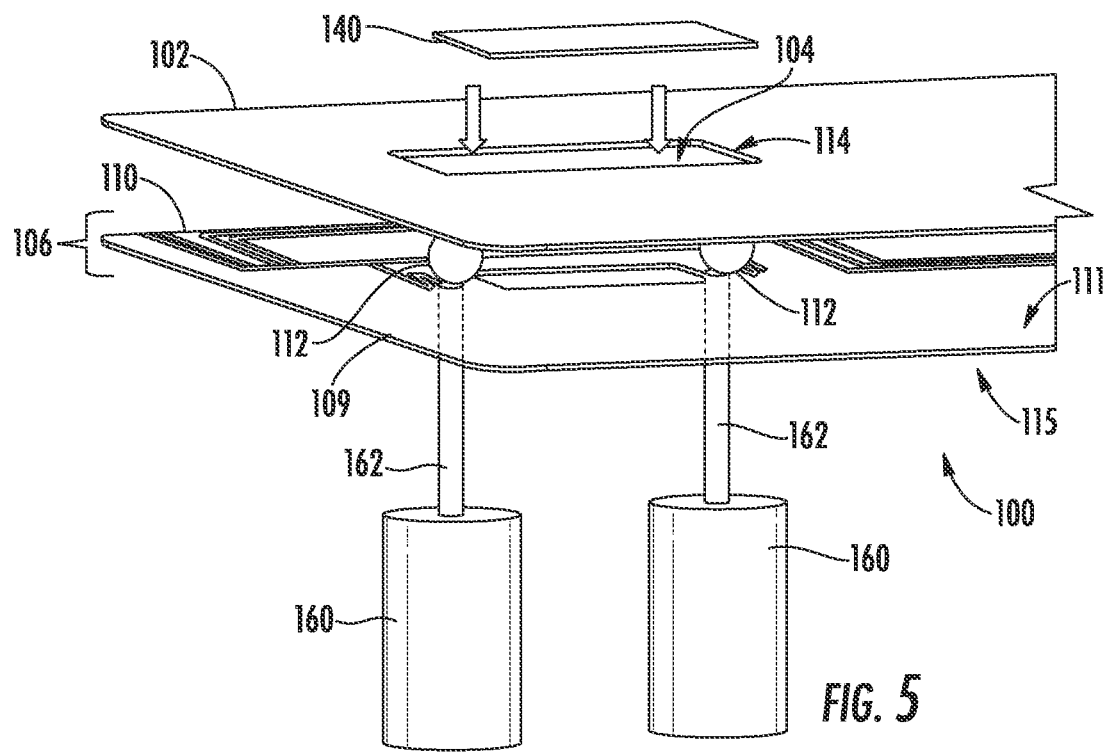
FIG. 5 is a side exploded view of a contactless card illustrating one instance during fabrication of a contactless card, in accordance with embodiments of the present disclosure.
Figure 6:
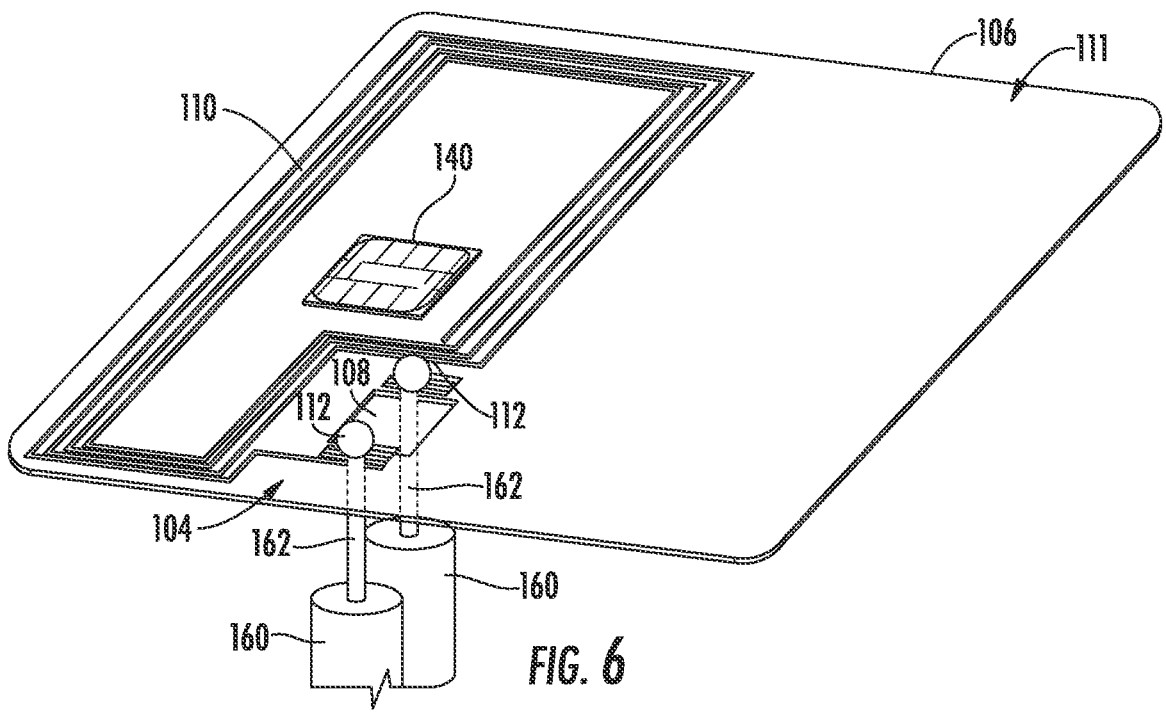
FIG. 6 is a top perspective view of the portions of the contactless card at the instance of FIG. 5, in accordance with embodiments of the present disclosure.

To illustrate this process, FIG. 5 presents a side exploded view of a contactless card illustrating one instance during fabrication of a contactless card, in accordance with embodiments of the present disclosure. FIG. 6 presents a top perspective view of the same operation as depicted in FIG. 5, with the card body 102 removed for clarity. In the operation depicted in FIGS. 5 and 6, a light source, such as a laser source 160, is arranged on the lower side 115 of the UV-transparent layer 109. In the example of FIG. 5, a laser source 160 is arranged to direct the laser beams 162 through the UV-transparent layer 109 to a pair of curable connectors 112, disposed on the first side 111 of the UV-transparent layer 109. According to different embodiments, the laser source 160 may include, for example, two laser beams, to simultaneously direct two different laser beams, each beam shown as a laser beam 162, to two different curable connectors. Thus, a first exposure, such as a first UV laser beam exposure may be directed to a first curable connector of the pair of curable connectors 112, while a second exposure, such as a second UV laser beam exposure may be directed to a second curable connector of the pair of curable connectors 112.

Alternatively, the laser source 160 may use just one laser to direct the laser beam 162 in a sequential manner through the UV-transparent layer 109 to a first of the curable connectors 112, and then to a second of the curable connectors 112. In accordance with various non-limiting embodiments, a wavelength of the radiation of the laser beam 162 may be in the ultraviolet range, such as below approximately 400 nm. The wavelength may be chosen to be suitable for a given material of the curable connectors 112. For example, some known epoxies may be suitable for curing using radiation in the range of 320 nm to 380 nm. Accordingly, the wavelength of laser beam 162 may be set in the range of 320 nm to 380 nm for examples where the curable connectors 112 are made from epoxy that is curable in this wavelength range. Of course for epoxies or other curable materials that are suitable for curing in a different wavelength range, the wavelength of laser beam 162 may be in the different range. In accordance with various non-limiting embodiments, the UV-transparent layer 109 may transmit more than 5%, than 10%, more than 20%, more than 50% percent of radiation from the side 115 to the first side 111, for UV radiation in the suitable range for curing the curable connectors 112, such as below 400 nm. Notably, the percent transmission of the UV-transparent layer 109 suitable for curing the curable connectors 112 will be dependent upon the epoxy material or other material used for curable connectors, and the sensitivity to the radiation. In some cases, a lower transmission may be compensated by increasing the amount of exposure time required for complete curing. Also, the power output of the laser beam 162 may be adjusted upwardly to adapt to lower percent transmission.

In addition, referring again to FIG. 4B, the serpentine pattern of the end regions 122, 124 may be arranged to provide a large fraction of exposed area of the curable connectors 112, meaning the area of second regions 138 ($A_{138}$). For example, the ratio of $A_{138}$ to the total area of the first regions 136 and second regions 138 ($A_{136+138}$), may be greater than 10%, greater than 20%, greater than 30%, greater than 50%, in some non-limiting embodiments. Again, the power or duration of exposure to laser beam 162 may be adjusted according to the percent transmission of UV-transparent layer 109 as well as the ratio of $A_{138}/(A_{136+138})$. Accordingly, the curable connectors may be exposed for a duration of 0.1 to seconds to many seconds to cause the curable connectors to cure. Notably, curing time may vary with energy intensity and exact material of the curable connectors. For example, curing using a mercury vapor lamp source having energy density in the range of 200 watt/inch may cure the curable connectors in a time frame of seconds to one minute, when positioned approximately 6-10 inches from the curable connectors. Curing user a laser source affords higher energy density and may therefore effect curing in a matter of tenths of seconds to a few seconds, for example.

In embodiments of a conductive adhesive material, such as conductive epoxy, the exposure to the laser beams 162 may result in rapid curing of the curable connectors 112, forming a solid bond between the antenna 110 and the contactless chip module 140, through the curable connectors 112. UV exposure accordingly triggers a polymerization (curing) reaction, promoting adhesion of the contactless chip module 140 with the antenna assembly layer 106.

Because the curable connectors are electrically conductive, an electrically conductive path is thus established between the antenna 110 and contactless chip module 140. The exposure to the laser beams 162 may be of sufficiently short duration, wherein the curable connectors 112 do not unduly deform, or spread out, so the curable connectors 112 do not touch the edges 114 of the window 104 defined by the card body 102.

Referring again to FIGS. 1-3, according to some embodiments, the recess 108 may accommodate a portion of the curable connectors 112 during the process to join the contactless chip modules 140 to the antenna 110. Because the recess 108 is below the main surface of the UV transparent layer on the first side 111, the curable connectors 112, under pressure, may tend to deform so as to flow into the recess 108, rather than toward the edge 114.

Figure 7:
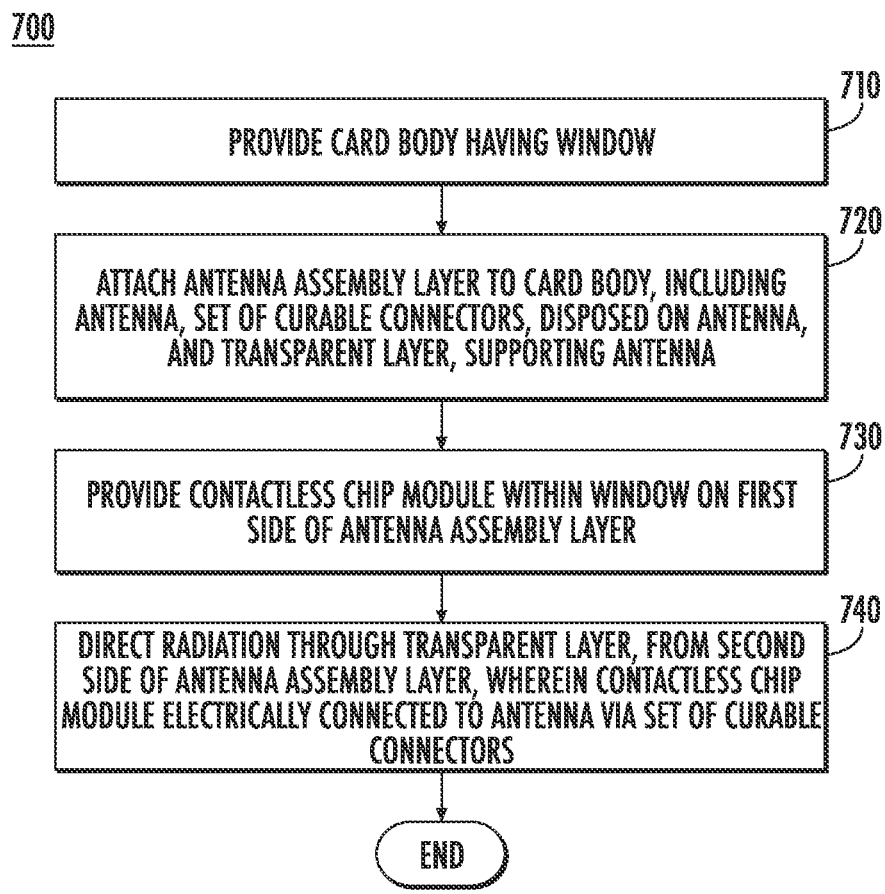
FIG. 7 illustrates a flowchart for performing methods in accordance with embodiments of the present disclosure.

FIG. 7 illustrates a flowchart 700 for performing methods in accordance with embodiments of the present disclosure. At block 710, a card body of a transaction card is provided, where the card body of includes a window. In some embodiments, the card body may be formed of a metallic material, while the window extends through the card body.

At block 720 an antenna assembly layer is attached to the card body. The antenna assembly layer may include a thin transparent layer, such as a UV transparent layer, where the transparent layer supports an antenna on a first side of the transparent layer. The antenna assembly layer may further include a set of curable connectors that are disposed over end regions of the antenna. In various embodiments, the set of curable connectors may be two curable connectors that are electrically conductive and are placed over the opposing end regions of the antenna in an uncured state. Suitable material for the set of curable connectors includes a conductive epoxy, or other conductive composite.

At block 730, a contactless chip module is provided within the window on the first side of the antenna assembly layer. In various embodiments, the curable connectors may extend above the antenna. As such, the contactless chip module may be brought into direct contact with the set of curable connectors. The contactless chip module may include two electrical contacts, for example, that are brought into contact with two respective curable connectors.

At block 740, when the contactless chip module is disposed in the window, radiation is directed through the transparent layer, from a second side of the antenna assembly layer, opposite the first side. The radiation may constitute UV radiation that cures the curable connectors, and facilitates adhesion between the curable connectors and the contactless chip module. In particular embodiments, the radiation may be directed as one or more laser beams characterized by an electromagnetic wavelength in the ultraviolet range, that impinges upon each curable connector of the set of curable connectors. At least a portion of the curable connectors may be directly disposed over the UV transparent layer, while another portion is disposed over end regions of the antenna. As such, the curable connectors may be sufficiently exposed to the radiation to cause rapid curing, wherein the contactless chip module becomes electrically connected to the antenna via the set of curable connectors.

Figure 8:
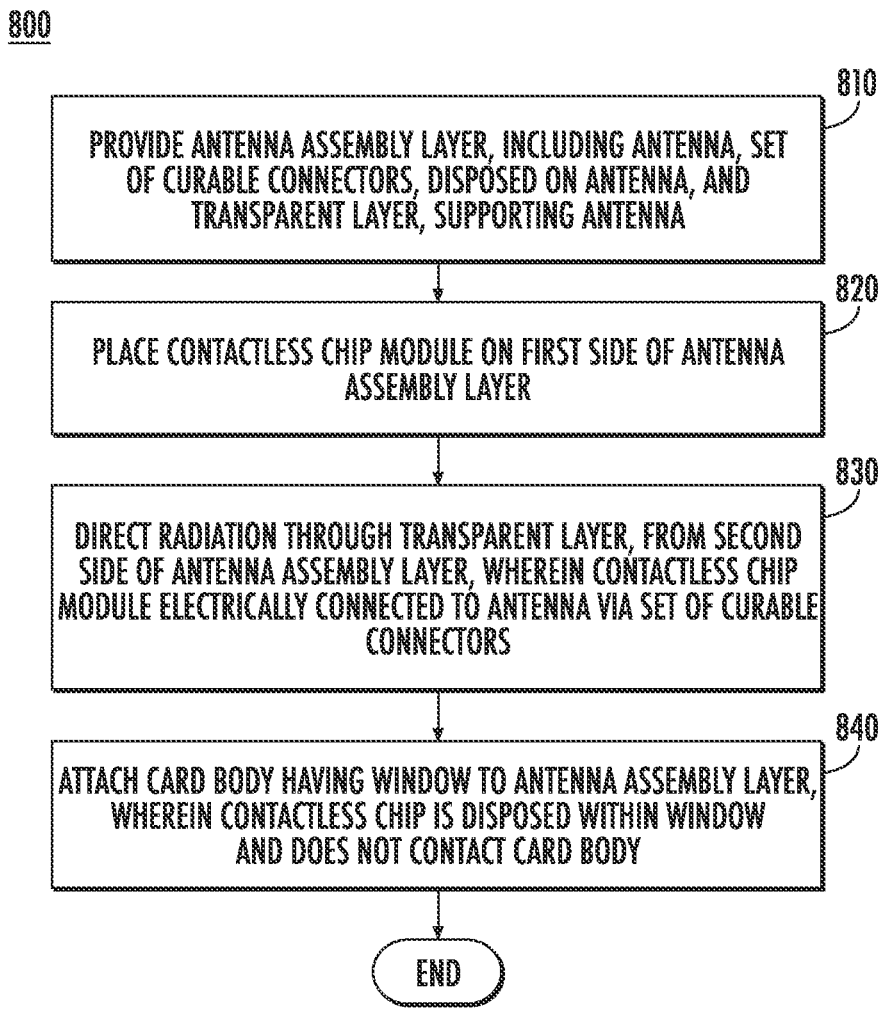
FIG. 8 illustrates another flowchart for performing methods in accordance with embodiments of the present disclosure.

FIG. 8 illustrates another flowchart 800 for performing methods in accordance with other embodiments of the present disclosure.

At block 810, an antenna assembly layer is provided, including an antenna, a set of curable connectors, disposed on the antenna, and a transparent layer, supporting the antenna. In various embodiments, the set of curable connectors may be two curable connectors that are electrically conductive and are placed over the opposing end regions of the antenna in an uncured state. Suitable material for the set of curable connectors includes a conductive epoxy, or other conductive composite.

At block 820, a contactless chip module is placed on a first side of the antenna assembly layer. The set of curable connectors may extend above the surface of the antenna, so that the contactless chip module is brought into direct contact with the set of curable connectors. The contactless chip module may include two electrical contacts, for example, that are brought into contact with two respective curable connectors.

At block 830, radiation is directed through the transparent layer, from a second side of the antenna assembly layer, wherein the contactless chip module is electrically connected to the antenna via the set of curable connectors. The radiation may constitute UV radiation that cures the curable connectors, and facilitates adhesion between the curable connectors and the contactless chip module. In particular embodiments, the radiation may be directed as one or more laser beams characterized by an electromagnetic wavelength in the ultraviolet range, that impinges upon each curable connector of the set of curable connectors. As such, the curable connectors may experience rapid curing, wherein the contactless chip module becomes electrically connected to the antenna via the set of curable connectors.

At block 840 a card body having a window is attached to the antenna assembly layer, in a manner wherein the contactless chip is disposed within the window and does not contact the card body. In other words, the card body may be placed in alignment with the antenna assembly layer in a manner that positions the window around the contactless chip.

Figure 9:
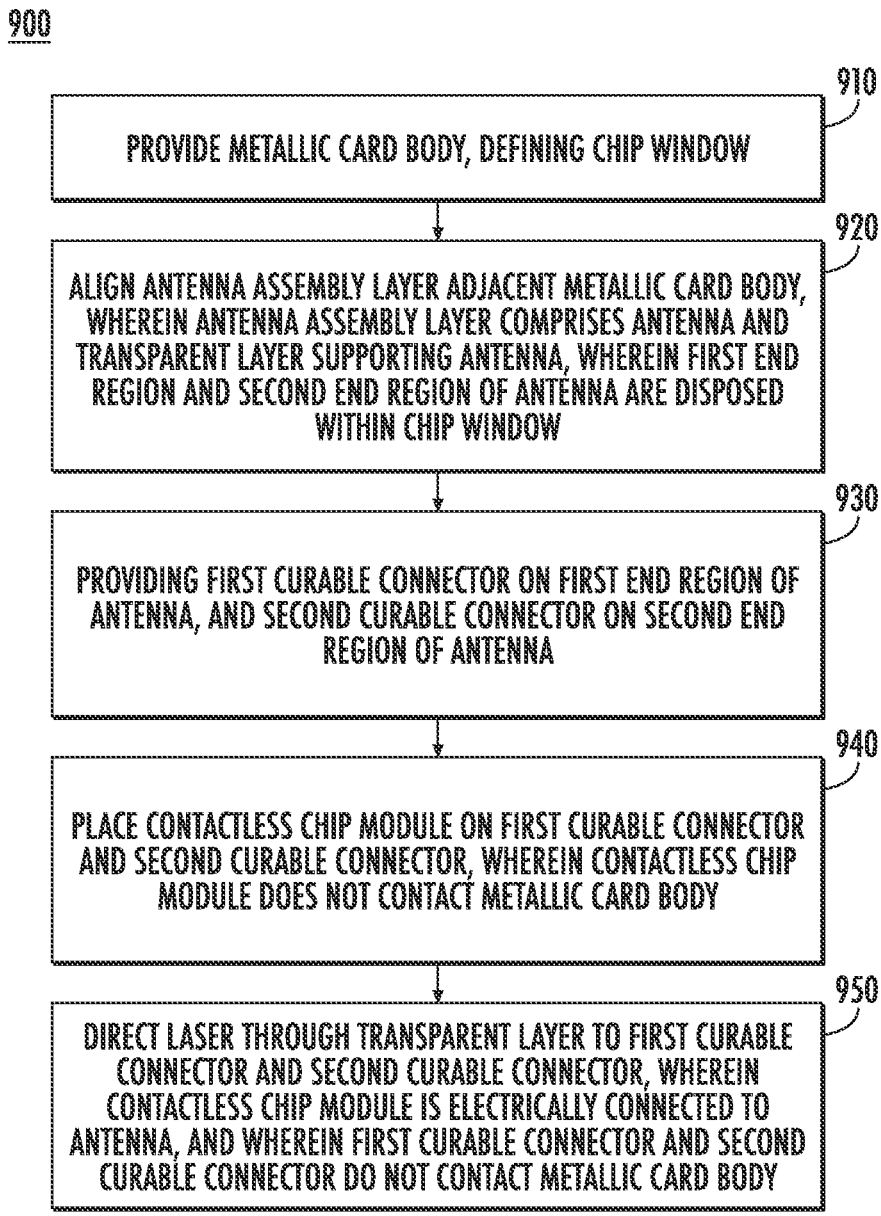
FIG. 9 illustrates another flowchart for performing methods in accordance with embodiments of the present disclosure.

FIG. 9 illustrates another flowchart 900 for performing methods in accordance with embodiments of the present disclosure. At block 910, a metallic card body is provided, where the metallic card body defines a chip window. The chip window may extend entirely through the metallic card body.

At block 920 an antenna assembly layer is aligned adjacent to the metallic card body, wherein the antenna assembly layer includes an antenna and transparent layer supporting the antenna. The antenna may include a first end region and second end region, such that the aligning of the antenna assembly layer places the first end region and the second end region within the chip window. In some embodiments, the antenna assembly layer may be joined to the card body at this stage.

At block 930 a first curable connector is provided on the first end region of the antenna, and a second curable connector is provided on the second end region of the antenna. The placement of the first curable connector and second curable connector on the first end region and the second end region, respectively, may take place when the first end region and second end region are located within the window of the card body. The first curable connector and the second curable connector may be electrically conductive such as a conductive epoxy, or other conductive composite.

At block 940 a contactless chip module is provided on the first curable connector and the second curable connector, in a manner wherein the contactless chip module does not contact the metallic card body. The contactless chip module may include a semiconductor chip, and two electrical contacts, for example, that are brought into contact with the first curable connector and the second curable connector when the contactless chip module is placed in the window of the metallic card body.

At block 950, a laser (beam) is directed through the transparent layer to the first curable connector and the second curable connector, so as to cure the first curable connector and the second curable connector. In some examples, the transparent layer may be a UV transparent layer, and the laser may be formed of radiation having a wavelength in the UV range. In some non-limiting embodiments, the laser may expose the first curable connector and the second curable connector for a duration of between 0.1 second and several seconds. As such, the contactless chip module may be electrically connected to the antenna, in a manner wherein the first curable connector and the second curable connector do not contact the metallic card body.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration and the dimensions, positions, order and relative sizes reflected in the drawings attached hereto may vary. Although non-limiting, the contactless card 150 and the contactless card 150 described herein may have standardized dimensions. For example, ISO/IEC 7816 is an international standard related to electronic identification cards with contacts, especially smart cards, managed jointly by the International Organization for Standardization (ISO) and the International Electrotechnical Commission (IEC). There are other standards, however, such as ISO/IEC 14443 for contactless cards (PayPass, PayWave, ExpressPay). A further standard ISO/IEC 7810 ID-1, with which most credit cards are compliant, defines dimensions as 85.60×53.98 mm (3.370×2.125 in) and a thickness of 0.76 mm (0.030 in).

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the above illustrative methods are described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the methods may be implemented in association with the formation and/or processing of structures illustrated and described herein as well as in association with other structures not illustrated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing an antenna assembly layer, the antenna assembly layer comprising an ultraviolet (UV)-transparent layer, an antenna disposed on the UV transparent layer, and a set of curable connectors, each of the curable connectors having a first portion disposed on the antenna and a second portion disposed over the UV transparent layer;
placing a contactless chip module on a first side of the antenna assembly layer;
directing radiation through the UV-transparent layer, from a second side of the antenna assembly layer, wherein the contactless chip module electrically connects to the antenna via the set of curable connectors; and
attaching a card body having a window to the antenna assembly layer, wherein the contactless chip is disposed within the window and does not contact that card body.

2. The method of claim 1, wherein the set of curable connectors comprise two curable connectors that are electrically conductive and are placed over opposing end regions of the antenna in an uncured state.

3. The method of claim 2, wherein the contactless chip module comprises two electrical contacts configured to physically contact the two curable connectors.

4. The method of claim 1, wherein the curable connectors comprise a conductive epoxy material.

5. The method of claim 1, wherein the curable connectors extends partially over a set of end regions of the antenna, and partially over exposed regions of the UV-transparent layer, not covered by the antenna.

6. The method of claim 1, wherein the card body comprises a metallic body, wherein an outer portion of the antenna extends subjacent to the metallic body, the method further comprising:
providing an insulator material between the outer portion of the antenna and the card body before the attaching the antenna assembly layer.

7. The method of claim 1, wherein the radiation comprises UV radiation that cures the curable connectors.

8. The method of claim 7, wherein, the radiation is directed as one or more laser beams characterized by an electromagnetic wavelength in an ultraviolet UV range, that impinges upon each curable connector of the set of curable connectors.

9. The method of claim 1, wherein attaching the card body having the window to the antenna assembly layer comprises placing the card body in alignment with the antenna assembly layer in a manner that positions the window around the contactless chip.

10. A non-transitory computer-readable storage medium, the computer-readable storage medium including instructions that when executed by a processor, cause the processor to:
provide an antenna assembly layer, the antenna assembly layer comprising an ultraviolet (UV)-transparent layer, an antenna disposed on the transparent layer, and a set of curable connectors, each of the curable connectors having a first portion disposed on the antenna and a second portion disposed over the UV transparent layer;
place a contactless chip module on a first side of the antenna assembly layer;
direct radiation through the UV-transparent layer, from a second side of the antenna assembly layer, wherein the contactless chip module electrically connects to the antenna via the set of curable connectors; and
attach a card body having a window to the antenna assembly layer, wherein the contactless chip is disposed within the window and does not contact that card body.

11. The computer-readable storage medium of claim 10, wherein the set of curable connectors comprises two curable connectors that are electrically conductive and are placed over opposing end regions of the antenna in an uncured state.

12. The computer-readable storage medium of claim 11, wherein the contactless chip module comprises two electrical contacts configured to physically contact the two curable connectors.

13. The computer-readable storage medium of claim 10, wherein the curable connectors comprise a conductive epoxy material.

14. The computer-readable storage medium of claim 10, wherein at least one curable connector extends partially over a set of end regions of the antenna, and partially over exposed regions of the UV-transparent layer, not covered by the antenna.

15. The computer-readable storage medium of claim 10, wherein the card body comprises a metallic body, wherein an outer portion of the antenna extends subjacent to the metallic body, wherein the instructions further configure the processor to: provide an insulator material between the outer portion of the antenna and the card body before the attaching the antenna assembly layer.

16. The computer-readable storage medium of claim 10, wherein the radiation comprises ultraviolet (UV) radiation that cures the curable connectors.

17. The computer-readable storage medium of claim 16, wherein, the radiation is directed as one or more laser beams characterized by an electromagnetic wavelength in an UV range, that impinges upon each curable connector of the set of curable connectors.

18. The computer-readable storage medium of claim 10, wherein attaching the card body having the window to the antenna assembly layer comprises the processor to place the card body in alignment with the antenna assembly layer in a manner that positions the window around the contactless chip.

19. A contactless card, comprising:
- an antenna assembly layer, the antenna assembly layer comprising an ultraviolet (UV)-transparent layer, an antenna disposed on the UV-transparent layer, and a set of curable connectors, each of the curable connectors having a first portion disposed on the antenna and a second portion disposed over the UV transparent layer;
- a contactless chip module placed on a first side of the antenna assembly layer; and
- a card body having a window to the antenna assembly layer, wherein the contactless chip is disposed within the window and does not contact that card body; and
- wherein the UV-transparent layer is configured to enable radiation through, from a second side of the antenna assembly layer, wherein the contactless chip module electrically connects to the antenna via the set of curable connectors.

\* \* \* \* \*